(12) United States Patent
Hatwar et al.

(10) Patent No.: US 6,692,846 B2
(45) Date of Patent: Feb. 17, 2004

(54) ORGANIC ELECTROLUMINESCENT DEVICE HAVING A STABILIZING DOPANT IN A HOLE-TRANSPORT LAYER OR IN AN ELECTRON-TRANSPORT LAYER DISTANT FROM THE EMISSION LAYER

(75) Inventors: Tukaram K. Hatwar, Penfield, NY (US); Ralph H. Young, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 49 days.

(21) Appl. No.: 10/176,026

(22) Filed: Jun. 20, 2002

(65) Prior Publication Data

US 2004/0001968 A1 Jan. 1, 2004

(51) Int. Cl.[7] ............................................... H05B 33/14
(52) U.S. Cl. ........................ 428/690; 428/917; 313/504; 313/506; 257/40; 257/102
(58) Field of Search ................................. 428/690, 917; 313/504, 506; 257/40, 102

(56) References Cited

U.S. PATENT DOCUMENTS

| | | | |
|---|---|---|---|
| 4,539,507 A | | 9/1985 | VanSlyke et al. |
| 4,769,292 A | | 9/1988 | Tang et al. |
| 4,885,211 A | | 12/1989 | Tang et al. |
| 5,059,062 A | | 10/1991 | Bresnahan |
| 5,593,788 A | | 1/1997 | Shi et al. |
| 5,645,948 A | | 7/1997 | Shi et al. |
| 5,776,622 A | | 7/1998 | Hung et al. |
| 5,792,557 A | * | 8/1998 | Nakaya et al. ............ 428/411.1 |
| 5,853,905 A | | 12/1998 | So et al. |
| 5,989,737 A | | 11/1999 | Xie et al. |
| 6,020,078 A | | 2/2000 | Chen et al. |
| 6,127,004 A | | 10/2000 | Hatwar et al. |
| 6,208,075 B1 | | 3/2001 | Hung et al. |
| 6,392,250 B1 | * | 5/2002 | Hu et al. .................... 428/690 |
| 6,627,333 B2 | * | 9/2003 | Hatwar ....................... 428/690 |
| 2002/0081456 A1 | * | 6/2002 | Hamada ...................... 428/690 |

OTHER PUBLICATIONS

Kim, C.H. et al., "Bright small molecular white organic light–emitting devices with two emission zones", Applied Physics Letters, vol. 80, No. 12, Mar. 25, 2002, pp. 2201–2203.*

"Improving the Efficiency and Stability of Organic Light Emitting Devices by Using Mixed Emitting Layers", by Zoran D. Popovic et al., SPIE, vol. 3478, Jul. 1998, pp. 68–73.

"Transparent Organic Light Emitting Devices", by G. Gu et al., Applied Physics Letter 68 (19), May 6, 1996, pp. 2606–2608.

"Interface Engineering in Preparation of Organic Surface–Emitting Diodes" by L. S. Hung et al., Applied Physics Letters, vol. 74, No. 21, May 24, 1999, pp. 3209–3211.

* cited by examiner

Primary Examiner—Cynthia H. Kelly
Assistant Examiner—Dawn L. Garrett
(74) Attorney, Agent, or Firm—Raymond L. Owens

(57) ABSTRACT

An organic electroluminescent device includes a substrate; an anode and a cathode positioned relative to the substrate; an emission layer disposed between the anode and the cathode; a hole-transport layer disposed between the anode and the emission layer; and an electron-transport layer disposed between the cathode and the emission layer. The hole-transport layer includes two or more sublayers, one sublayer containing a stabilizing dopant, and the sublayer adjacent to the emission layer containing no stabilizing dopant. Alternatively or in addition, the electron-transport layer includes two or more sublayers, one sublayer containing a stabilizing dopant, and the sublayer adjacent to the emission layer containing no stabilizing dopant. The stabilizing dopant includes rubrene or derivatives thereof.

36 Claims, 8 Drawing Sheets

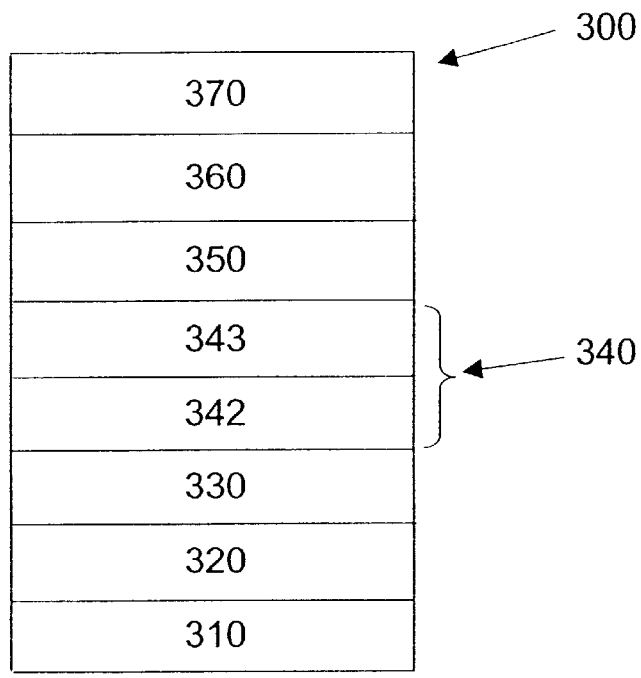
FIG. 3 (Invention)
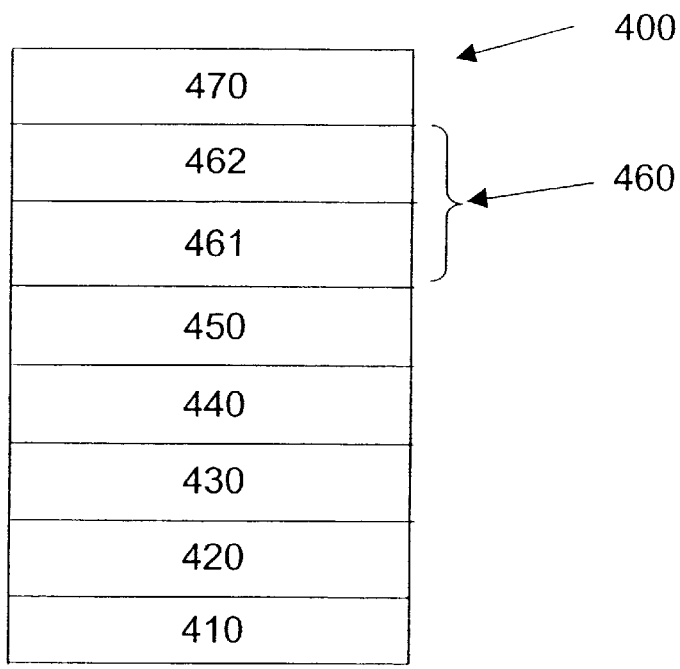
FIG. 4 (Invention)

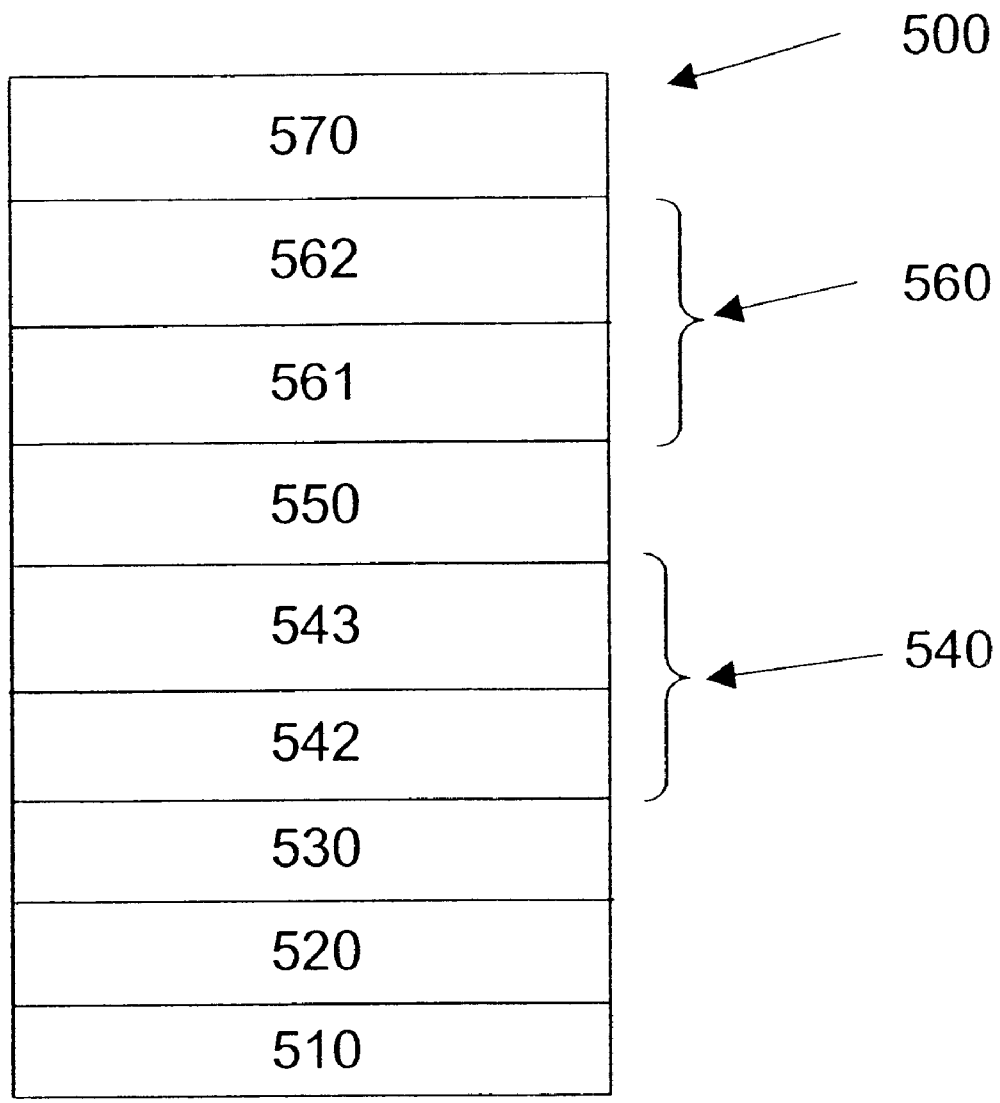
FIG. 5 (Invention)

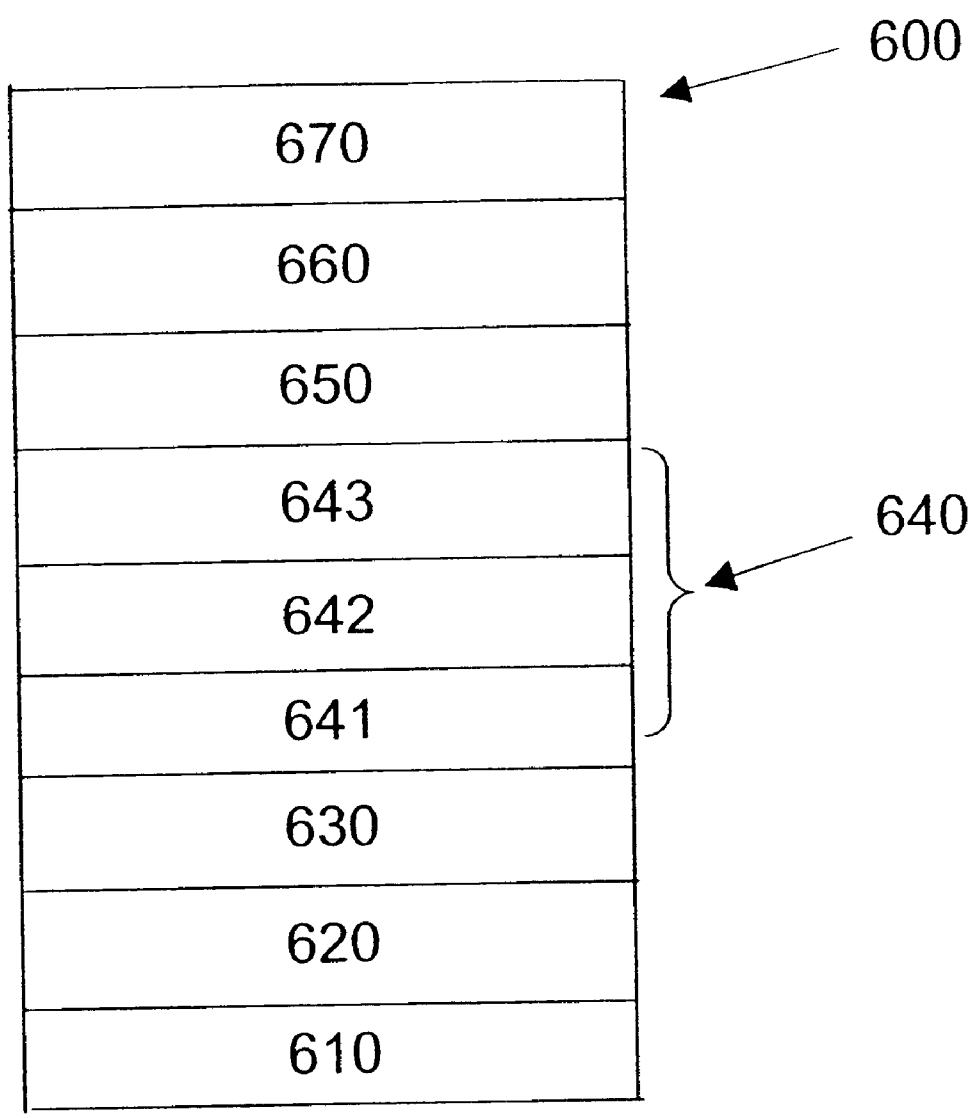
FIG. 6 (Invention)

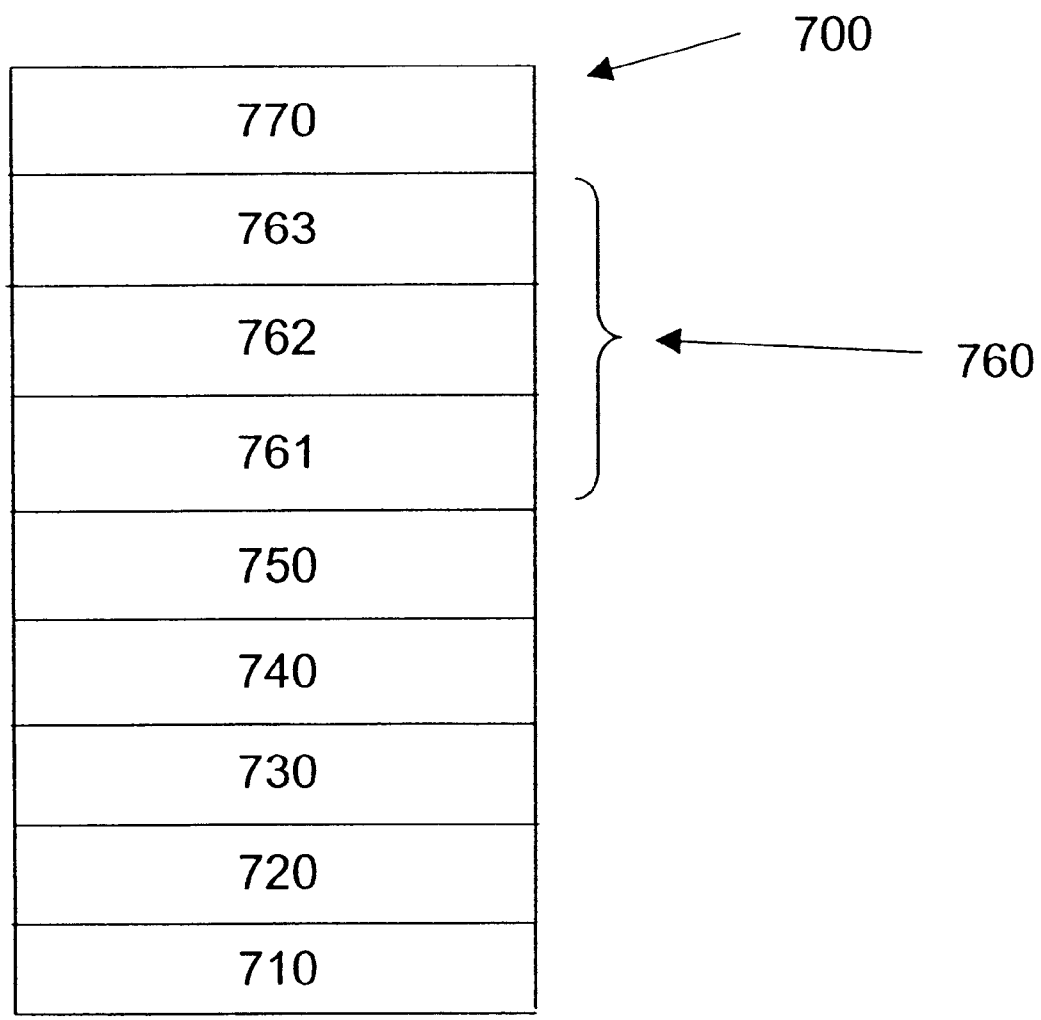
FIG. 7 (Invention)

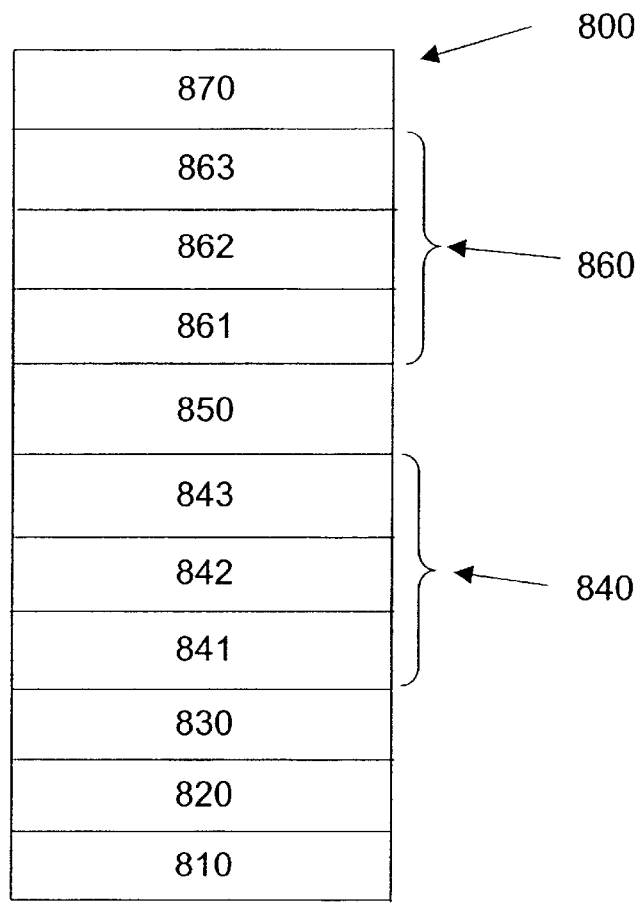
FIG. 8 (Invention)
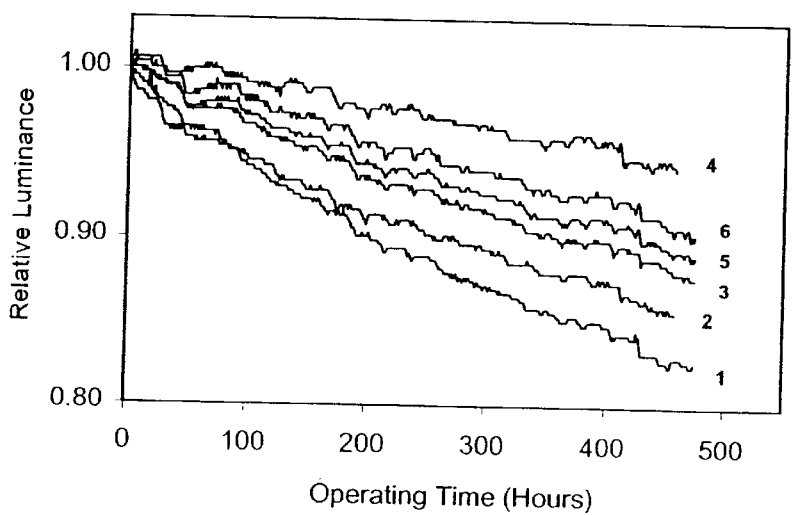
FIG. 9

ORGANIC ELECTROLUMINESCENT DEVICE HAVING A STABILIZING DOPANT IN A HOLE-TRANSPORT LAYER OR IN AN ELECTRON-TRANSPORT LAYER DISTANT FROM THE EMISSION LAYER

CROSS REFERENCE TO RELATED APPLICATIONS

Reference is made to commonly assigned U.S. patent application Ser. No. 09/875,646, filed Jun. 6, 2001, now U.S. Pat. No. 6,565,996, by Tukaram K. Hatwar et al., entitled "Organic Light-Emitting Device Having a Color-Neutral Dopant in a Hole-Transport Layer and/or in an Electron-transport Layer"; commonly assigned U.S. patent application Ser. No. 09/923,024, pending, filed Aug. 6, 2001 by Tukaram K. Hatwar et al., entitled "Organic Light-Emitting Device Having a Color-Neutral Dopant in an Emission Layer and in a Hole-transport Layer"; and commonly assigned U.S. patent application Ser. No. 09/651,624, pending, filed Aug. 30, 2000 by Tukaram K. Hatwar, entitled "White Organic Electroluminescent Devices With Improved Stability and Efficiency", the disclosures of which are herein incorporated by reference

FIELD OF THE INVENTION

The present invention relates to organic electroluminescent devices and more particularly to doping a hole-transport layer or an electron-transport layer with suitable stabilizing dopants such as rubrene, distant from the emission layer, to improve the operating lifetime of these devices without affecting the electroluminescent color.

BACKGROUND OF THE INVENTION

A common form of organic electroluminescent device, or organic light-emitting diode (OLED), includes a substrate and, disposed thereupon, a multilayer structure comprising an anode, an optional hole-injection layer, a hole-transport layer, an emission layer, an optional electron-transport layer, and a cathode, each layer of the multilayer structure except the anode and cathode comprising one or more organic or organometallic compounds. Electroluminescent (EL) devices are attractive because of their low driving voltage, high luminance, wide viewing angle, and capability for full-color flat-panel emissive displays. Tang et al. described this OLED structure in their U.S. Pat. Nos. 4,769,292 and 4,885,211. With the prospect of using OLEDs in display screens for laptop computers, digital personal organizers, cellular telephones etc., it is highly desirable to improve the operating lifetime of these devices.

The following patents and publications disclose the preparation of OLEDs with improved operating lifetimes. Modifications of the multilayer structure, stabilized cathode materials, and confinement of the charge carriers and their recombination within the emission zone have achieved significant improvement in the operating lifetimes of these devices. So et al., in U.S. Pat. No. 5,853,905, discussed an EL device consisting of a single organic emission layer containing a mixture of electron-transport and hole-transport materials, sandwiched between anode and cathode. However, this device has low efficiency. Popovic et al., in SPIE Conference Proceedings, Vol. 3476, pp. 68–72, 1998, described an EL device with improved efficiency and operating lifetime prepared by mixing an emitting electron-transport material and a hole-transport material in a light-emitting layer. Xie et al., in U.S. Pat. No. 5,989,737, disclosed an OLED in which the hole-transport layer comprises a tertiary aromatic amine doped with a polycyclic aromatic hydrocarbon such as rubrene. This approach has the problem that some dopants, such as rubrene, alter the electroluminescent color of the device.

SUMMARY OF THE INVENTION

It is therefore an object of the present invention to provide an OLED with improved operating lifetime.

This object is achieved by an organic electroluminescent device comprising:
 a) a substrate;
 b) an anode and a cathode positioned relative to the substrate;
 c) an emission layer disposed between the anode and the cathode;
 d) a hole-transport layer disposed between the anode and the emission layer;
 e) an electron-transport layer disposed between the cathode and the emission layer;
 f) the hole-transport layer including two or more sublayers, one sublayer containing a stabilizing dopant, and the sublayer adjacent to the emission layer containing no stabilizing dopant; and
 g) the stabilizing dopant including rubrene or a derivative thereof.

This object is also achieved by an organic electroluminescent device comprising:
 a) a substrate;
 b) an anode and a cathode positioned relative to the substrate;
 c) an emission layer disposed between the anode and the cathode;
 d) a hole-transport layer disposed between the anode and the emission layer;
 e) an electron-transport layer disposed between the cathode and the emission layer;
 f) the electron-transport layer including two or more sublayers, one sublayer containing a stabilizing dopant, and the sublayer adjacent to the emission layer containing no stabilizing dopant; and
 g) the stabilizing dopant including rubrene or a derivative thereof.

This object is further achieved by an organic electroluminescent device comprising:
 a) a substrate;
 b) an anode and a cathode positioned relative to the substrate;
 c) an emission layer disposed between the anode and the cathode;
 d) a hole-transport layer disposed between the anode and the emission layer;
 e) an electron-transport layer disposed between the cathode and the emission layer;
 f) the electron-transport layer including two or more sublayers, one sublayer containing a stabilizing dopant, and the sublayer adjacent to the emission layer containing no stabilizing dopant;
 g) the hole-transport layer including two or more sublayers, one sublayer containing a stabilizing dopant, and the sublayer adjacent to the emission layer containing no stabilizing dopant; and
 h) the stabilizing dopant or dopants including rubrene or a derivative thereof.

The operating lifetime of the OLED is improved by inclusion of the stabilizing dopant or dopants, while the electroluminescent color and efficiency are substantially unaffected.

ADVANTAGES

The use of a stabilizing dopant distant from the emission layer does not affect the electroluminescent properties of the present OLEDs and permits the electroluminescent color to be tuned solely by adjusting the composition of the emission layer. It has been found that rubrene and derivatives thereof can be used as stabilizing dopants in the hole-transport layer, the electron-transport layer, or both the electron-transport layer and the hole-transport layer of an OLED and that the resulting device has a greater operating lifetime than an otherwise identical device that contains no stabilizing dopant.

Other features and advantages of the present invention include the following:

OLEDs with various electroluminescent colors, such as red, green, blue, or white, can be constructed by inclusion of suitable dopants in the emission layer. Thereby, it is possible to construct OLEDs with simultaneously optimized lifetime and chromaticity;

OLEDs of this invention have high luminance efficiency;

OLEDs of this invention can be used with a low-voltage current source;

OLEDs of the present invention can include a stabilizing dopant in both the hole-transport and the electron-transport layers, in order to provide yet greater operating lifetimes than that of an OLED containing a stabilizing dopant in either the hole-transport layer alone or the electron-transport layer alone; and OLEDs made in accordance with the present invention have long operating lifetimes and excellent luminance properties.

BRIEF DESCRIPTION OF THE DRAWINGS

FIG. 3 depicts an OLED according to the present invention;

FIG. 4 depicts a further OLED according to the present invention;

FIG. 5 depicts a still further OLED according to the present invention;

FIG. 6 depicts another OLED according to the present invention;

FIG. 7 depicts another OLED according to the present invention;

FIG. 8 depicts yet another OLED according to the present invention;

FIG. 9 is a graph showing the luminance as a function of operating time, relative to the initial luminance, for green emitting OLEDs according to the present invention;

The drawings in FIGS. 1–8 are necessarily of a schematic nature, since the individual layers are too thin and thickness differences of the various elements too great to permit depiction to scale or to permit convenient proportionate scaling.

DETAILED DESCRIPTION OF THE INVENTION

The emission layer of an OLED comprises an organic or organometallic material that produces light, known as electroluminescence, as a result of electron-hole recombination in the layer. Hereinafter, the term organic will be taken to include both purely organic and organometallic materials. In the simplest construction of the prior art, shown in FIG. 1, an emission layer 150 is sandwiched between an anode 120 and a cathode 170. The emission layer can be a single pure material with a high luminescent efficiency. A well known material for this purpose is tris(8-quinolinolato-N1,O8)aluminum (Alq), which produces excellent green electroluminescence. The emission layer can also contain lesser amounts of other materials, conventionally called dopants, whose function in this structure is to alter the EL efficiency or the color of the emitted light. A substrate 110 provides mechanical support for the OLED and for electrical leads connecting the OLED to a source of electrical current. Layers 110 through 170 together comprise the OLED 100. The cathode, or both the anode and the substrate, are transparent to the electroluminescent light, allowing that light to be viewed. The term transparent refers to the ability to transmit no less than 70 percent of light at wavelengths belonging to the EL spectrum of the device when that light is incident perpendicularly to the surface. In a variant of this structure, the cathode, rather than the anode, rests upon the substrate. In that variant, either the anode, or both the cathode and the support, are transparent to the electroluminescent light. When the cathode and anode are connected to a source of electrical current (not shown), holes are injected from the anode and electrons are injected from the cathode, and they recombine in the emission layer to produce electroluminescent light.

Figure 1:
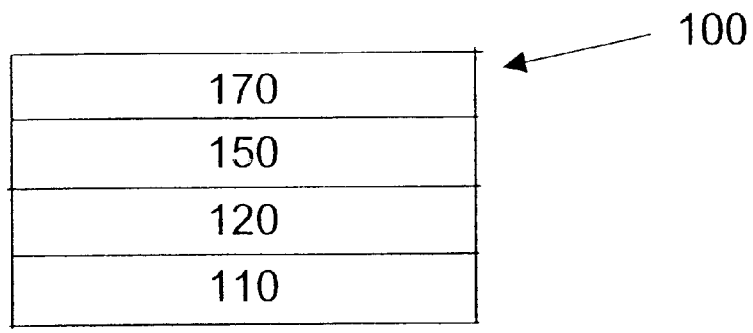
FIG. 1 depicts a prior art OLED.
Figure 2:
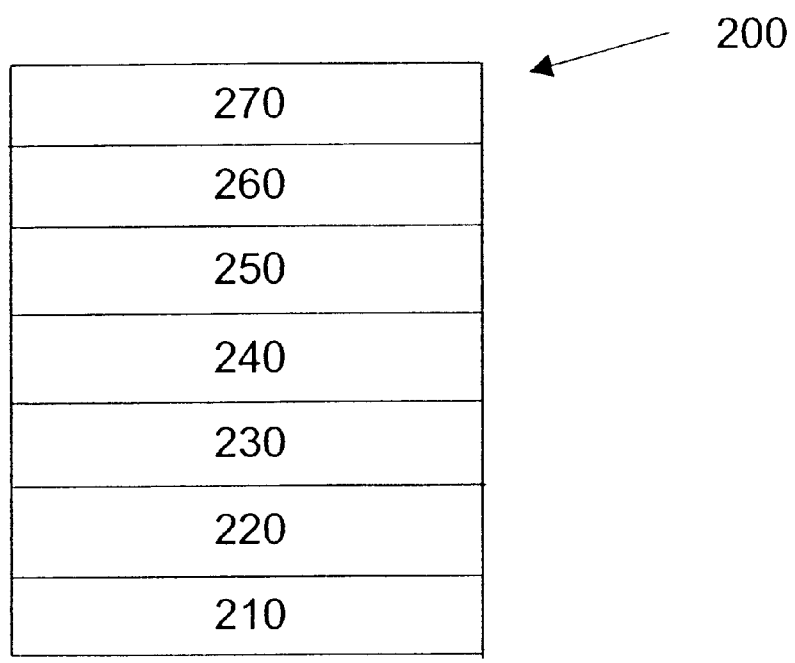
FIG. 2 depicts another prior art OLED.

In a more elaborate structure of the prior art, shown in FIG. 2, an emission layer (EML) 250 is situated between a hole-transport layer (HTL) 240 and an electron-transport layer (ETL) 260. Each of these layers is composed predominantly of organic materials. The two transport layers deliver holes from an anode 220 and electrons from a cathode 270, respectively, to the emission layer. An optional hole-injection layer (HIL) 230 facilitates the injection of holes from the anode to the hole-transport layer. The emission layer functions as the primary site for electron-hole recombination and emission of the resulting electroluminescent light. In this respect, the functions of the individual organic layers are distinct and can therefore be optimized independently. Thus, the emission layer can be optimized for a desirable EL color and a high luminance efficiency. The emission layer can also contain lesser amounts of dopants whose function in this structure is to alter the EL efficiency or the color of the emitted light. Likewise, the hole- and electron-transport layers can be optimized for their charge-transport properties. A substrate 210 provides mechanical support for the OLED and for electrical leads connecting the OLED to a source of electrical current. Layers 210 through 270 together comprise the OLED 200. Either the cathode, or both the anode and the substrate, are transparent to the electroluminescent light. In a variant of this structure, the cathode, rather than the anode, rests upon the substrate. In that variant, either the anode, or both the cathode and the support, are transparent to the electroluminescent light. In another variant of this structure, the emission layer and the electron-transport layer can be combined to form a single layer that performs the functions of both.

When an electrical potential difference (not shown) is applied between the anode 220 and the cathode 270, the cathode injects electrons into the electron-transport layer 260, and they migrate across that layer to the emission layer 250. At the same time, holes are injected from the anode 220 into the hole-transport layer 240, either directly or via the optional hole-injection layer 230, and they migrate across the hole-transport layer to the emission layer. The holes and electrons recombine in the emission layer 250, frequently near the junction between the hole-transport layer and the emission layer. Part of the energy released by the recombination process is emitted as electroluminescence, which escapes through the transparent anode or cathode and/or the substrate. If the transparent anode or cathode is adjacent to a transparent substrate, the electroluminescence further escapes through the substrate.

FIG. 3 depicts an OLED of the present invention. This OLED 300 is similar to the OLED of the prior art 200 shown in FIG. 2, except that the hole-transport layer 340 includes two sublayers, 342 and 343. Sublayer 342 is distant from the emission layer 350, and it contains a stabilizing dopant of the present invention, whereas sublayer 343 is adjacent to the emission layer and contains no stabilizing dopant. Additional components include the substrate 310, anode 320, optional hole-injection layer 330, electron-transport layer 360, and cathode 370. Further subdivision of the layers or sublayers into sublayers with varying composition is within the scope of this invention, provided that the sublayer of the hole-transport layer adjacent to the emission layer contains no stabilizing dopant. It is also possible for the cathode, rather than the anode, to reside on the substrate. The electrical functions and optical requirements are the same as for the OLED of the prior art shown in FIG. 2.

FIG. 4 depicts another OLED of the present invention. This OLED 400 is similar to the OLED of the prior art 200 except that the electron-transport layer 460 includes two sublayers, 461 and 462. Sublayer 462 is distant from the emission layer 450 and is doped with a stabilizing dopant of the present invention, whereas sublayer 461 is adjacent to the emission layer and contains no stabilizing dopant. Additional components include the substrate 410, anode 420, optional hole-injection layer 430, hole-transport layer 440, and cathode 470. Further subdivision of the layers or sublayers is within the scope of this invention. It is also possible for the cathode, rather than the anode, to reside on the substrate. The electrical functions and optical requirements are the same as for the OLED of the prior art shown in FIG. 2.

FIG. 5 depicts yet another OLED of the present invention. This OLED 500 is similar to OLED 200 of the prior art but includes the inventive features of both OLEDs 300 and 400. The hole-transport layer 540 includes two sublayers, 542 and 543. The electron-transport layer 560 also includes two sublayers, 561 and 562. Sublayers 542 and 562 are distant from the emission layer 550 and are doped with a stabilizing dopant of this invention. Sublayers 543 and 561 are adjacent to the emission layer 550 and contain no stabilizing dopant. The same or different stabilizing dopants can be used in sublayers 542 and 562. Additional components include the substrate 510, anode 520, optional hole-injection layer 530, and cathode 570. Further subdivision of the layers or sublayers is within the scope of this invention. It is also possible for the cathode, rather than the anode, to reside on the substrate. The electrical functions and optical requirements are the same as for the OLED of the prior art shown in FIG. 2.

FIG. 6 depicts an OLED with yet another structure of the hole-transport layer 640. This OLED 600 is similar to the OLED 300 except that the hole-transport layer comprises three sublayers 641, 642, and 643. Sublayer 641 is adjacent to the anode 620 or optional hole-injection layer 630. Sublayer 642 is distant from both the emission layer 650 and the anode 620 or optional hole-injection layer 630. Sublayer 643 is adjacent to the emission layer. Sublayer 642 contains a stabilizing dopant of this invention. Sublayers 641 and 643 contain no stabilizing dopant. Additional components include the substrate 610, electron-transport layer 660, and cathode 670.

FIG. 7 depicts an OLED with yet another structure of the electron-transport layer 760. This OLED 700 is similar to the OLED 400 except that the electron-transport layer 760 comprises three sublayers 761, 762, and 763. Sublayer 762 is distant from both the emission layer 750 and the cathode 770. Sublayer 761 is adjacent to the emission layer, and sublayer 763 is adjacent to the cathode. Sublayer 762 is doped with a stabilizing dopant of this invention. Sublayers 761 and 763 contain no stabilizing dopant. Additional components include the substrate 710, anode 720, optional hole-injection layer 730, and hole-transport layer 740.

FIG. 8 depicts yet another OLED 800 structure, which combines a hole-transport layer 840 similar to that of OLED 600 and an electron-transport layer 860 similar to that of OLED 700. Sublayers 841, 842, and 843 of the hole-transport layer are similar in composition to sublayers 641, 642, and 643 of OLED 600. Sublayers 861, 862, and 863 are similar in composition to sublayers 761, 762, and 763 of OLED 700. Additional components include the substrate 810, anode 820, optional hole-injection layer 830, emission layer 850 and cathode 870.

Other OLED structures comprising a stabilizing dopant in a sublayer of the hole-transport layer, a sublayer of the electron-transport layer, or both a sublayer of the hole-transport layer and a sublayer of the electron-transport layer are within the scope of this invention, provided that the sublayers containing the stabilizing dopant are distant from the emission layer. Thus, for example, the hole-transport layer may comprise two sublayers similar to sublayers 342 and 343 of FIG. 3, while the electron-transport layer comprises three sublayers similar to sublayers 761, 762, and 763 of FIG. 7. The hole-transport layer, the electron-transport layer, or both the hole-transport layer and the electron-transport layer may individually include more than one sublayer containing a stabilizing dopant of this invention, still provided that the sublayers adjacent to the emission layer do not contain a stabilizing dopant of this invention.

The substrate of an OLED can be constructed of glass, quartz, or a plastic material and can, optionally, incorporate additional layers serving additional functions such as color-filter layers to remove unwanted spectral components from the electroluminescent light.

An OLED can be viewed as a diode, which is forward biased when the anode is at a higher electrical potential than the cathode. The cathode and anode of the OLED can each take any convenient conventional form, such as any of the various forms disclosed by Tang et al., U.S. Pat. No. 4,885,211. The operating voltage can be substantially reduced by use of a low-work-function cathode and a high-work-function anode.

For most purposes, the preferred cathodes are those constructed of a combination of a metal having a work function less than 4.0 eV and one at least one other metal. The Mg:Ag alloy of Tang et al., U.S. Pat. No. 4,885,211, constitutes one preferred cathode material. The Al:Mg alloys of Van Slyke et al., U.S. Pat. No. 5,059,062, are another preferred cathode material. Hung et al., in U.S. Pat. No. 5,776,622, have disclosed the use of a LiF|Al bilayer to enhance electron injection in OLEDs. This and similar bilayers can be used as cathodes in the present invention. In some cases, it is desirable to fabricate an OLED using an opaque support such as a silicon substrate. In such cases, it is preferred to use a cathode material that is transparent in the range of wavelengths emitted by the OLED, as described in publications by Gu et al., Applied Physics Letters, Vol. 68, pp. 2606–2608 (1996) and Hung et al., Applied Physics Letters, Vol. 74, pp. 3209–3211 (1999).

Conventional anodes are formed of a conductive and transparent metal oxide. Indium tin oxide (ITO) has been widely used as the anode material because of its transparency, good conductivity, and high work function. It is the preferred anode material in the present invention.

In a preferred embodiment, a hole-injection layer is disposed between the anode and the hole-transport layer. A preferred material in such a hole-injection layer is a fluorocarbon ($CF_x$) such as those disclosed in commonly assigned U.S. Pat. Nos. 6,208,075 and 6,127,004.

A preferred embodiment of the emission layer comprises a host material capable of transporting both electrons and holes and doped with a relatively small amount of one or more additional materials known as dopants, as described by Tang et al. in U.S. Pat. No. 4,769,292. Conventional host materials for the emission layer include metal complexes with the 8-hydroxyquinolate anion, also known as metal-chelated oxinoid compounds, and metal complexes with derivatives of 8-hydroxyquinolate. Examples include tris(8-quinolinolato-N1,O8) aluminum (Alq), tris(8-quinolinolato-N1,O8)gallium (Gaq), tris(8-quinolinolato-N1,O8)indium (Inq), bis(8-quinolinolato-N1,O8)magnesium (Mgq), bis(8-quinolinolato-N1,O8)zinc (Znq), and the like. Most preferred among these complexes is Alq. Dopants for the emission layer are commonly chosen to be highly luminescent compounds.

Another class of conventional host materials for the emission layer includes 9,10-diaryl-substituted anthracenes such as 9,10-bis(4-(2,2-diphenylethenyl)phenyl)anthracene, and AND and TBADN, whose structures are shown below.

ADN

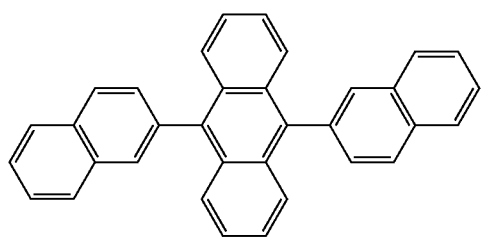

TBADN

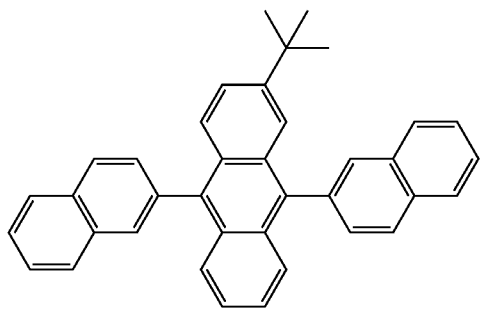

Preferred among these anthracene derivatives are ADN and TBADN.

It is also possible to use an undoped material, such as the materials described above as host materials, as the sole constituent of the emission layer. The choice of this undoped material, or the choice of host material to be used with a dopant, depend, in part, on the desired emission color and/or the chemical nature of any dopant to be used in that layer. Undoped materials comprising metal complexes with 8-hydroxyquinolate, such as Alq, are useful for green emission. Host materials including such metal complexes, including Alq, are useful with dopants of the coumarin or quinacridone class for green emission and derivatives of DCM for red emission. Host materials comprising 9,10-diaryl-substituted anthracenes are particularly useful with blue-emitting dopants such as derivatives of perylene.

A preferred green-emitting coumarin is C545T as described by Tang et al. in U.S. Pat. No. 6,020,078. A preferred green-emitting quinacridone is CFDMQA as described by Shi et al. in U.S. Pat. No. 5,593,788. A preferred red-emitting dye, which is a derivative of DCM, is DCJTB. The structures of DCM and DCJTB are shown below.

DCM

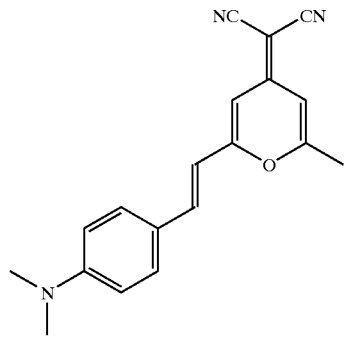

DCJTB

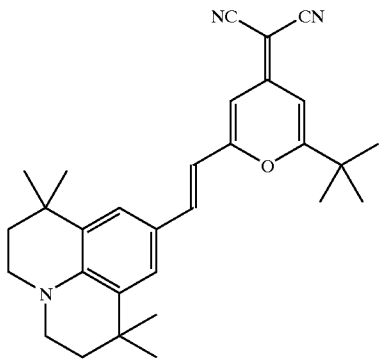

A preferred blue-emitting perylene derivative is TBP, namely, 2,5,8,11-tetra-tert-butylperylene.

Other host materials and other dopants can be used in the present invention. The quantity of a dopant in an emission layer, relative to the host material, is usually between 0.01 and 10% and preferably between 0.5 and 2%. Hereinafter, in describing the composition of a mixed material, a percentage refers to a percentage by volume.

Materials useful in the electron-transport layer of this invention include metal complexes with the 8-hydroxyquinolate anion, such as those described above, as disclosed in U.S. Pat. No. 4,885,211. Such materials both exhibit high levels of performance and are readily fabricated in thin layers. They can be used as the sole material of an undoped electron-transport layer or an undoped sublayer of an electron-transport layer. They can also be used as the host material in a doped sublayer of an electron-transport layer. Materials of this class are currently preferred. Most preferred is Alq. Other materials known in the art can be used in the electron-transport layer of this invention. An example is TPBI, described in U.S. Pat. No. 5,645,948 by Shi et al. If a transparent cathode is used, it is preferred to use materials in the electron-transport layer that are also transparent.

Materials useful in the hole-transport layer of this invention include tertiary amines as taught by Van Slyke et al. in U.S. Pat. No. 4,539,507. They can be used as the sole material of an undoped hole-transport layer or an undoped sublayer of a hole-transport layer. They can also be used as the host material in a doped sublayer of a hole-transport layer. Materials of this class are currently preferred. Most preferred is NPB, namely 4,4'-Bis[N-(1-napthyl)-N-phenylamino]biphenyl as described by Van Slyke et al. in U.S. Pat. No. 4,539,507.

The stabilizing dopants of this invention, herein termed rubrene or derivatives thereof, include 5,6,11,12-tetra-substituted naphthacenes having the following formula:

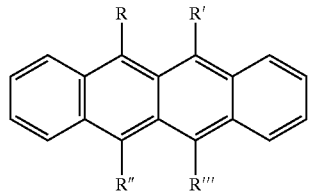

R, R', R", and R''', which may be the same or different, are individually aryl groups such as phenyl, biphenylyl, or naphthyl; or heteroaryl groups such as benzothiazolylphenyl. Examples of such stabilizing dopants include 5,6,11,12-tetraphenylnaphthacene and 5,6,11,12-tetrakis(2-naphythl)naphthacene. Additional substituents such as alkyl, aryl, fluorinated alkyl, fluoro, or cyano may be present on the naphthacene moiety, on the aryl or heteroaryl groups R, R', R", and R''', or on both the naphthacene moiety and the aryl or heteroaryl groups R, R', R", and R'R". An example of such an additionally substituted stabilizing dopant is 6,11-diphenyl-5,12-bis(4-(6-methyl-benzothiazol-2-yl)phenyl)naphthacene. Currently preferred are rubrene or derivatives thereof with molecular weights not exceeding about 800 Daltons. Currently most preferred is rubrene.

The quantity of a stabilizing dopant in a hole-transport layer or an electron-transport layer, relative to the host material, is usually between 0.1 and 30% and preferably between 1 and 25%.

The thickness of the hole-transport layer is between 20 and about 200 nm and preferably between 70 and 150 nm. The thickness of the emission layer is between 20 and about 100 nm and preferably between 20 and 75 nm. The thickness of the electron-transport layer is between 20 and about 100 nm and preferably between 20 and 75 nm. When a sublayer of the hole-transport layer includes a stabilizing dopant of this invention (sublayer 342, 542, 642 or 842 in FIGS. 3, 5, 6, or 8, respectively), and one or more sublayers of the hole-transport layer contain no stabilizing dopant, the thickness of each such sublayer is no more than about 200 nm and preferably not more than 100 nm. The thickness of each such sublayer is no less than about 2 nm if it is adjacent to the anode or the optional hole-injection layer, no less than about 1 nm otherwise, and preferably no less than about 10 run in either case. Similarly, when a sublayer of the electron-transport layer comprises a stabilizing dopant of this invention (sublayer 462, 562, 762, or 862 in FIGS. 4, 5, 7, or 8, respectively), and one or more sublayers of the electron-transport layer contain no stabilizing dopant, the thickness of each such sublayer is no more than about 50 nm and preferably not more than 40 nm. The thickness of each such sublayer is no less than about 2 nm if it is adjacent to the cathode, no less than about 1 nm otherwise, and preferably no less than about 10nm. The thickness of the cathode layer is between 10 and 300 nm and preferably between 50 nm and 200 nm.

Devices of the structures shown in FIGS. 5 and 8, in which a stabilizing dopant of the present invention is present in both a sublayer 542 and 842 of the hole-transport layer and a sublayer 562 or 862 of the electron-transport layer, have significantly greater operating lifetimes than similar devices in which only a sublayer of the hole-transport layer or only a sublayer of the electron-transport layer includes a stabilizing dopant of the present invention.

A useful method for constructing OLEDs of the present invention includes vapor deposition in a vacuum chamber. This method permits the organic layers and the metal cathode to be deposited sequentially upon the anode without significant interference or mixing of the layers. The thickness of each individual layer and its composition can be precisely controlled in the deposition process. To produce the desired composition of each layer, the rate of deposition for each component is independently controlled using a deposition rate monitor.

As illustrated in the following Examples, there is considerable variation in the extent to which the operating lifetime of an OLED is increased by the use of a stabilizing dopant according to the present invention. A lifetime extension factor ($LEF_{90}$) can be defined for comparison of an OLED of the present invention relative to a control OLED that contains a stabilizing dopant in neither the hole-transport layer nor the electron-transport layer. Both the OLED of the present invention and the control OLED are operated at 20 $mA/cm^2$ and room temperature until the luminance of each has diminished below 90% of its initial value. The time at which the luminance at 20 $mA/cm^2$ decreases to 90% of its initial value is defined as the $t_{90}$ of the device. The ratio of the $t_{90}$ for the inventive OLED to that for the control is defined as the lifetime extension factor ($LEF_{90}$) for the inventive OLED. Generally speaking, it is desirable for $LEF_{90}$ to be as large as possible. The evaluation of $LEF_{90}$ is illustrated in the following Examples.

EXAMPLES

The invention and its advantages are further illustrated by the specific examples that follow. In describing the concentration of a dopant, any percentage refers to percentage by volume of the dopant with respect to the total material in the layer.

Comparative Example 1

A green-emitting OLED of the prior art was constructed according to the structure shown in FIG. 2 in the following manner. An ITO coating, 80 nm thick on a glass plate, was patterned to produce the anodes 220 for several OLEDs on the same glass substrate 210. The plate, with the anodes, was then sequentially ultrasonicated in a commercial detergent, rinsed in deionized water, and degreased in toluene vapor. The ITO layer was treated with an oxygen plasma for about one minute and then coated with 1 nm of a fluorocarbon layer by plasma assisted deposition of $CHF_3$ to produce a $CF_x$ hole-injection layer 230. The resulting coated substrates were transferred to a vacuum chamber. There, the following additional layers were deposited in sequence over the hole-injection layer by vacuum vapor deposition: 150 nm of NPB as the hole-transport layer (HTL) 240, 37.5 nm of undoped Alq as the emission layer (EML) 250, 37.5 nm of undoped Alq as the electron-transport layer (ETL) 260, and 200 nm of a Mg:Ag alloy (in the ratio 90:10) as the cathode 270. The above sequence completed the construction of the OLED 200. The OLED was transferred to a glove box filled with dry nitrogen, where it was enclosed along with a desiccant in a hermetically-sealed package for protection against the ambient environment.

The EL characteristics of one of these OLEDs were evaluated using a constant-current source and a photometer. The initial luminance efficiency, CIE coordinates $CIE_x$ and $CIE_y$, and drive voltage, all at a DC current density of 20 $mA/cm^2$, are shown in Table I. The operating stability of this OLED was evaluated by monitoring its luminance and drive voltage while operating it in a repetitive manner consisting of 40 $mA/cm^2$ constant current for 0.5 milliseconds alternating with 14 V constant reverse bias for 0.5 milliseconds. Thus, the average current density was 20 $mA/cm^2$. The luminance, relative to its initial value, is shown as a function of operating time in FIG. 9. The luminance of this device reached 90% of its initial value after 210 hours of operation. Thus, $t_{90}$ for this device was 210 hours. The initial EL characteristics and operating stability of additional OLEDs, described in Examples 2–6, below, were evaluated with the same driving conditions and in the same manner as in this Example, and they are also reported in Table I and FIG. 9. The numerals adjacent to traces in FIG. 9 indicate the corresponding Examples.

Example 2

An OLED of the present invention was constructed with the structure of OLED 300 shown in FIG. 3. The hole-transport layer 340 consisted of a 120 nm sublayer 342 of NPB doped with 1.5% of 5,6,11,12-tetraphenylnaphthacene, also known as rubrene, and a 30 nm sublayer 343 of undoped NPB. Thus, the rubrene-doped sublayer was 30 nm distant from the emission layer. In all other regards, the structure and construction of this device were the same as for the OLED of Comparative Example 1.

The luminance of this OLED reached 90% of its initial value after 275 hours of operation. Thus, $t_{90}$ for this OLED was 275 hours. The lifetime extension factor, $LEF_{90}$, for this device was evaluated by dividing this value of $t_{90}$ by the value of $t_{90}$ for the control device of Comparative Example 1. Thus, $LEF_{90}$ for this device was 1.3. This value is reported in Table VI. The values of $LEF_{90}$ for the additional OLEDs of Examples 3–6 were evaluated similarly, again using the device of Comparative Example 1 as the control OLED and they are also reported in Table VI.

Examples 3–6

The OLEDs of Examples 3–6 were prepared similarly to the OLED Example 2, except that the percentage of rubrene in the doped sublayer 342 of the hole-transport layer was varied between 3 to 15%. The percentage of rubrene in each device is also reported in Table I.

As can be seen from Table I, the initial luminance yields, CIE coordinates, and drive voltages for Examples 2–6 of the present invention are similar to those for the prior art device of Comparative Example 1. However, the plot of luminance as a function of time, shown in FIG. 9, shows increased operating stability for the devices of Examples 2–6 as compared to the control device of Example 1. The lifetime extension factors for the devices of Examples 2 to 6, reported in Table VI, exceed 1.2 and, in some cases, exceed 2.0. Thus, an improved operating stability with respect to the luminance is achieved without any significant change in the initial luminance, color, and drive voltage of the devices. In addition, the drive voltages at 20 $mA/cm^2$ DC changed by less than 10% during the operating times shown in FIG. 9. Therefore, OLEDs of the present invention possess far greater operating lifetimes than OLEDs of the prior art without any significant adverse effect on other parameters of EL performance.

Comparative Example 7

Figure 10:
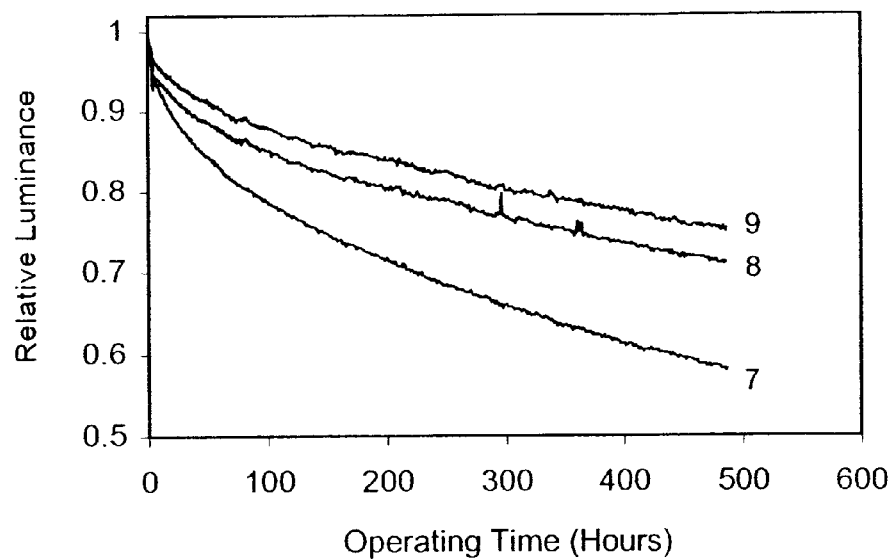
FIG. 10 is a graph showing the relative luminance as a function of operating time for blue-emitting OLEDs according to the present invention.

A blue-emitting OLED of the prior art, according to the structure shown in FIG. 2, was prepared similarly to the device of Comparative Example 1 except that the ETL was 35 nm thick, and the EML was 20 nm thick and consisted of AND doped with 2% TBP. The initial luminance efficiency, CIE coordinates, and drive voltage are shown in Table II. The relative luminance as a function of operating time is shown in FIG. 10. The initial EL characteristics and operating stability of additional OLEDs, described in Examples 8 and 9, below, were evaluated with the same driving conditions and in the same manner as in Comparative Example 1, and they are also reported in Table II, Table IV, and FIG. 10. For the evaluation of LEF90, the OLED of this Comparative Example was used as a control. The numerals adjacent to traces in FIG. 10 indicate the corresponding Examples.

Example 8

A blue-emitting OLED of the present invention was prepared with the structure of the OLED 300 shown in FIG. 3. The hole-transport layer 340 consisted of a 30 nm sublayer 342 of NPB doped with 1.5% rubrene, and a 120 nm sublayer 343 of undoped NPB. Thus the rubrene-doped NPB sublayer was 120 nm distant from the emission layer. In all other regards, the OLED was identical to that of Comparative Example 7.

Example 9

A blue-emitting OLED of the present invention was prepared with the structure of OLED 600 shown in FIG. 6. The hole-transport layer 640 consisted of 30 nm of undoped NPB as sublayer 641, 90 nm of NPB doped with 1.5% rubrene as sublayer 642, and 30 nm of undoped NPB as sublayer 643. Thus the rubrene-doped NPB sublayer 642 was 90 nm thick, was sandwiched between two undoped sublayers 641 and 643, and was 30 nm distant from the blue emission layer. In all other regards, the OLED was identical to that of Comparative Example 7.

As can be seen from Table II, the initial luminance yields, CIE coordinates, and drive voltages for Examples 8 and 9 of the present invention are very similar to those for the prior art device of Comparative Examples 7. However, the plot of luminance as a function of time, shown in FIG. 10, shows increased operating stability for the devices of Examples 8 and 9 as compared to the prior art device of Examples 7. The lifetime extension factors for the devices of Examples 8 and 9, reported in Table IV, exceed 1.8. Thus, an improved operating stability with respect to the luminance is achieved without any significant change in the initial luminance, color, and drive voltage of the devices. In addition, the drive voltages at 20 mA/cm$^2$ DC changed by less than 15% for the inventive devices of Examples 8 and 9 during the operating times shown in FIG. 10. Therefore, OLEDs of the present invention possess far greater operating lifetimes than OLEDs of the prior art without any significant adverse effect on other parameters of EL performance.

Comparative Example 10

Figure 11:
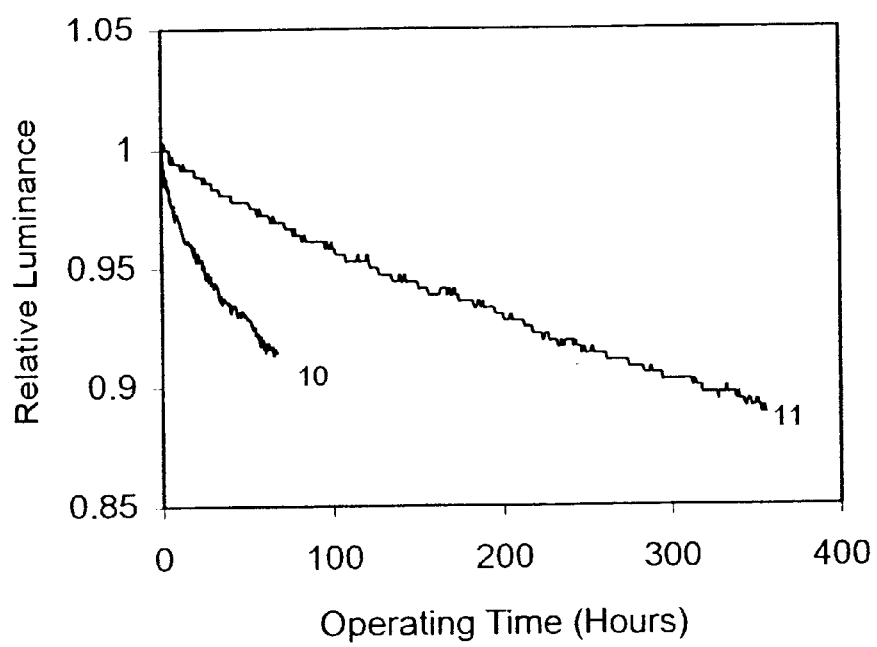
FIG. 11 is a graph showing the relative luminance as a function of operating time for blue-emitting OLEDs according to the present invention.

A blue-emitting OLED of the prior art was prepared similarly to that of Examples 7. In particular, the ETL 260 consisted of 35 nm of Alq. The initial luminance efficiency, CIE coordinates, and drive voltage are shown in Table III. The relative luminance as a function of operating time is shown in FIG. 11. The initial EL characteristics and operating stability of an additional OLED, described in Example 11 below, were evaluated with the same driving conditions and in the same manner as in Comparative Example 1, and they are also reported in Table III and FIG. 11. However, the operation of the OLED of this example was terminated before its luminance reached 90% of the original value. Therefore, LEF$_{90}$ was not evaluated for the OLED of Example 11. The numerals adjacent to traces in FIG. 11 indicate the corresponding Examples.

Example 11

An OLED of the present invention was prepared with the structure of the OLED 700 shown in FIG. 7. The electron-transport layer 760 consisted of a 10 nm sublayer 761 of undoped Alq, a 5 nm sublayer 762 of Alq doped with 2% rubrene, and a 20 nm sublayer 763 of undoped Alq. Thus the rubrene-doped Alq sublayer 762 was 5 nm thick, was sandwiched between two undoped electron-transport sublayers 761 and 763, and was 10 nm distant from the blue emission layer. In all other regards, the OLED was identical to that of Comparative Examples 7 and 10.

As can be seen from Table III, the devices of Examples 10 and 11 have similar luminance yields, CIE coordinates, and drive voltages. However, the plot of luminance as a function of time, shown in FIG. 11, shows increased stability for the device of Example 11 as compared to the prior art device of Example 10. Thus, an improved operating stability with respect to the luminance is achieved without any significant change in the initial luminance, color, and drive voltage of the devices. In addition, the drive voltages at 20 mA/cm$^2$ DC changed by less than 6% for both devices during the operating times shown in FIG. 11. Therefore, OLEDs of the present invention possess greater operating lifetimes than OLEDs of the prior art without any significant adverse effect on other parameters of EL performance.

Comparative Example 12

Figure 12:
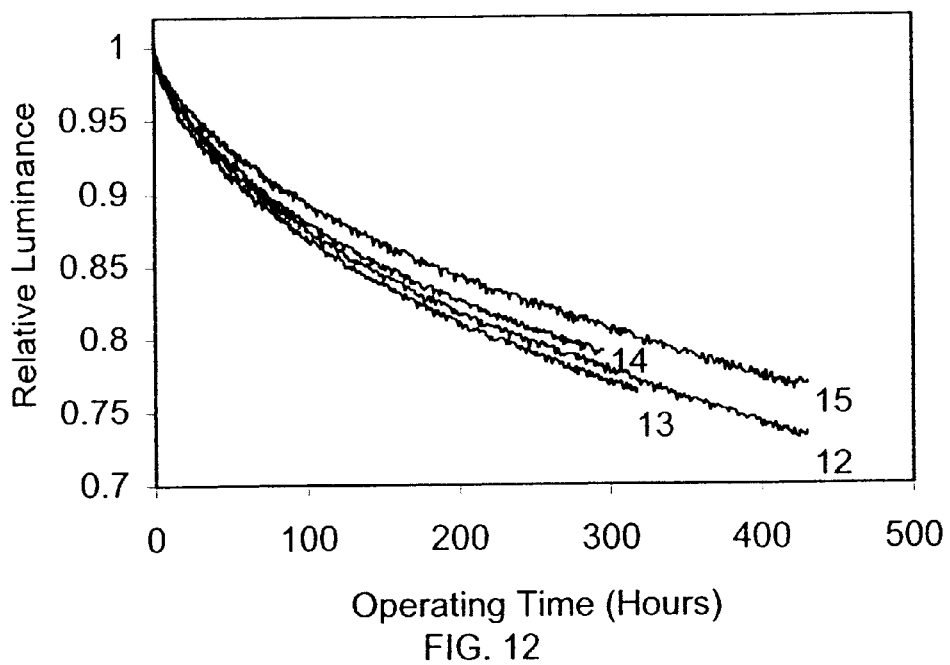
FIG. 12 is a graph showing the relative luminance as a function of operating time for green-emitting OLEDs according to the present invention.

A green-emitting OLED of the prior art, according to the structure shown in FIG. 2, was prepared similarly to the device of Comparative Example 1 except that the ETL was 35 nm thick, and the EML was 35 nm thick and consisted of Alq doped with 0.5% CFDMQA. The initial luminance efficiency, CIE coordinates, and drive voltage are shown in Table IV. The relative luminance as a function of operating time is shown in FIG. 12. The initial EL characteristics and operating stability of additional OLEDs, described in Examples 13–15 below, were evaluated with the same driving conditions and in the same manner as in Comparative Example 1, and they are also reported in Table IV Table VI, and FIG. 12. For the evaluation of LEF90, the OLED of this Comparative Example was used as a control. The numerals adjacent to traces in FIG. 12 indicate the corresponding Examples.

Examples 13–15

Green-emitting OLEDs of the present invention were prepared with the structure of OLED 600 shown in FIG. 6. The hole-transport layer 640 consisted of 30 nm of undoped NPB as sublayer 641, 90 nm of NPB doped with rubrene as sublayer 642, and 30 nm of undoped NPB as sublayer 643. Thus, the rubrene-doped NPB sublayer 642 was 90 nm thick, was sandwiched between two undoped sublayers 641 and 643, and was 30 nm distant from the blue emission layer. In all other regards, the OLED was identical to that of Comparative Example 12. The percentage of rubrene in sublayer 642 of each device is reported in Table IV along with the initial EL parameters.

As can be seen from Table IV, the devices of Examples 12–15 have similar luminance yields, CIE coordinates, and drive voltages. The plot of luminance as a function of time, shown in FIG. 12, shows a small decrease in stability for the device of Example 13, relative to the device of Comparative Example 12, a very small increase in stability for the device of Example 14, and a larger increase in stability for the device of Example 15. The lifetime extension factor for the device of Example 15, reported in Table VI, exceeds 1.2. The lack of improvement in the case of Example 13 may be a consequence of the small concentration of the stabilizing dopant. It is not presently known why the improvement in Example 14 is much smaller than the improvements in earlier Examples of the present invention.

Example 16

Figure 13:
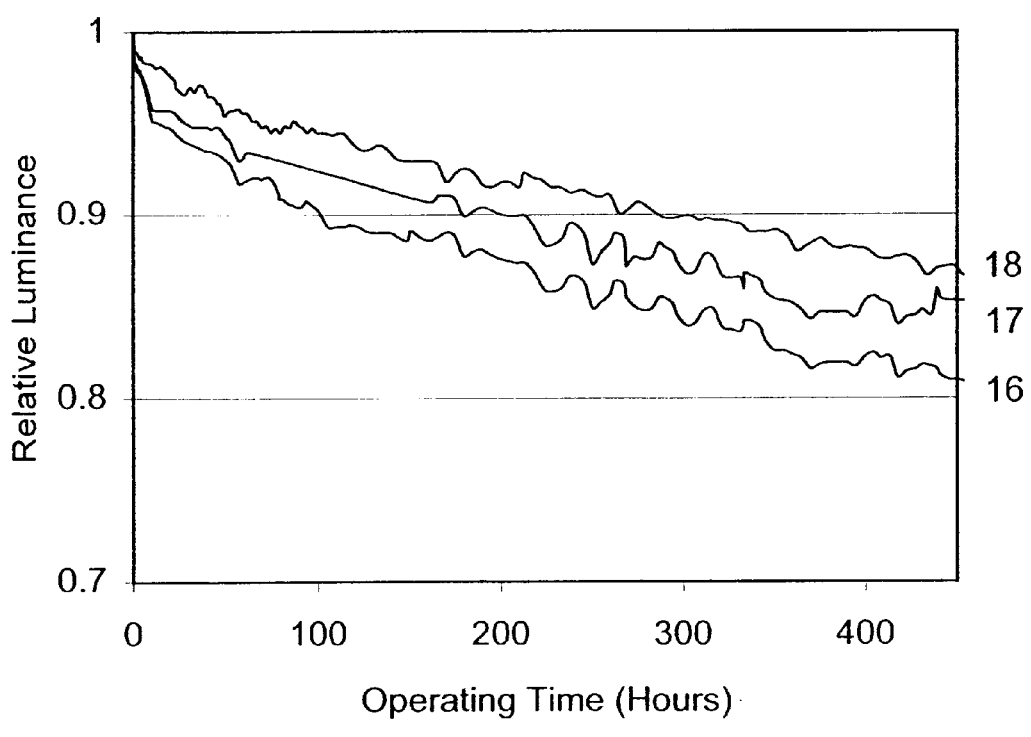
FIG. 13 is a graph showing the relative luminance as a function of operating time for green-emitting OLEDs according to the present invention.

A green-emitting OLED of the present invention was prepared with the structure of OLED 600 shown in FIG. 6. The hole-transport layer 640 consisted of 90 nm of undoped NPB as sublayer 641, 30 nm of NPB doped with 5% rubrene as sublayer 642, and 30 nm of undoped NPB as sublayer 643. The emission layer 650 was 35 nm thick and consisted of undoped Alq. The electron-transport layer 660 was 35 nm thick and consisted of undoped Alq. In all other regards, the OLED was identical to that of Comparative Example 1. The initial luminance efficiency, CIE coordinates, and drive voltage are shown in Table V. The relative luminance as a function of operating time is shown in FIG. 13. The initial EL characteristics and operating stability of additional OLEDs, described in Examples 17 and 18 below, were evaluated with the same driving conditions and in the same manner as in Comparative Example 1, and they are also reported in Table V and FIG. 13. The numerals adjacent to traces in FIG. 13 indicate the corresponding Examples.

Example 17

A green-emitting OLED of the present invention was prepared with the structure of OLED 700 shown in FIG. 7. The hole-transport layer 740 consisted of 150 nm of undoped NPB. The electron-transport layer 760 consisted of 10 nm of undoped Alq as sublayer 761, 10 nm of Alq doped with 5% rubrene as sublayer 762, and 15 nm of undoped Alq as sublayer 763. In all other regards, the OLED was identical to that of Example 16.

Example 18

A green-emitting OLED of the present invention was prepared with the structure of OLED 800 shown in FIG. 8. The hole-transport layer was like that of Example 16. In all other regards, the OLED was identical to that of Example 17. Thus, both the hole-transport layer and the electron-transport layer included sublayers doped with rubrene as a stabilizing dopant, and those sublayers were at least 10 nm distant from the emission layer 850.

As can be seen from Table V, the devices of Examples 16–18 have similar luminance yields, CIE coordinates, and drive voltages. The plot of luminance as a function of time, shown in FIG. 13, shows increased operating stability for the device of Example 18 as compared to the devices of Examples 16 and 17. Thus, an improved operating stability with respect to the luminance is achieved by including a sublayer doped with a stabilizing dopant in both the hole-transport layer and the electron-transport layer, as compared to the operating stability achieved by including such a doped sublayer in only the hole-transport layer or only the electron-transport layer. This improved operating stability is achieved without any significant change in the initial luminance, color, and drive voltage of the devices. In addition, the drive voltages at 20 mA/cm$^2$ DC changed by less than 1% for all three devices during the operating times shown in FIG. 13. Therefore, OLEDs according to the present invention that contain the stabilizing dopant in both the hole-transport layer and the electron-transport layer possess greater operating lifetimes than OLEDs of the present invention that contain the stabilizing dopant in only the hole-transport layer or only the electron-transport layer, without any significant adverse effect on other parameters of EL performance.

TABLE I

Structure, composition, and EL properties of the OLEDs of Examples 1–6. Row 2 indicates the layer or sublayer of the HTL according to FIGS. 2 and 3. Upper and lower numbers in Rows 3–8 and Columns 2–4 indicate thickness in nm and percentage of rubrene in each sublayer. Columns 5–8 refer to initial performance at a current density of 20 mA/cm$^2$

| Example | Thickness (nm) % rubrene 240 | 342 | 343 | Luminance yield (cd/A) | CIEx | CIEy | Drive voltage (V) |
|---|---|---|---|---|---|---|---|
| 1 | 150 0 | | | 2.4 | 0.33 | 0.54 | 8.4 |
| 2 | | 120 1.5% | 30 | 2.5 | 0.34 | 0.55 | 8.2 |
| 3 | | 120 3% | 30 | 2.5 | 0.34 | 0.55 | 8.4 |
| 4 | | 120 5% | 30 | 2.5 | 0.34 | 0.55 | 8.2 |
| 5 | | 120 10% | 30 | 2.3 | 0.34 | 0.55 | 8.0 |
| 6 | | 120 15% | 30 | 2.2 | 0.35 | 0.54 | 8.3 |

TABLE II

Structure, composition, and EL properties of the OLEDs of Examples 7–9. Row 2 indicates the layer or sublayer of the HTL according to FIGS. 2, 3, and 6. Remaining entries have the same meaning as in Table I

| Example | Thickness (nm) % rubrene 240 or 641 | 342 or 642 | 343 or 643 | Luminance yield (cd/A) | CIEx | CIEy | Drive voltage (V) |
|---|---|---|---|---|---|---|---|
| 7 | 150 | | | 3.0 | 0.16 | 0.24 | 8.8 |
| 8 | | 30 1.5% | 120 | 3.1 | 0.17 | 0.25 | 9.2 |
| 9 | 30 | 90 1.5% | 30 | 3.0 | 0.16 | 0.24 | 9.2 |

TABLE III

Structure, composition, and EL properties of the OLEDs of Examples 10 and 11. Entries have the same meaning as in Table I, except that Row 2 indicates the layer or sublayer of the ETL according to FIGS. 2 and 7.

| Example | Thickness (nm) % rubrene 260 or 761 | 762 | 763 | Luminance yield (cd/A) | CIEx | CIEy | Drive voltage (V) |
|---|---|---|---|---|---|---|---|
| 10 | 35 | | | 2.7 | 0.16 | 0.25 | 7.4 |
| 11 | 10 | 5 2% | 20 | 2.6 | 0.19 | 0.27 | 7.5 |

TABLE IV

Structure, composition, and EL properties of the OLEDs of Examples 12–15. Row 2 indicates the layer or sublayer of the HTL according to FIGS. 2 and 6. Remaining entries have the same meaning as in Table I

| Example | Thickness (nm) % rubrene 240 or 641 | 642 | 643 | Luminance yield (cd/A) | CIEx | CIEy | Drive voltage (V) |
|---|---|---|---|---|---|---|---|
| 12 | 150 0 | | | 5.6 | 0.32 | 0.63 | 10.3 |
| 13 | 30 | 90 1.5% | 30 | 5.9 | 0.32 | 0.64 | 10.0 |
| 14 | 30 | 90 5% | 30 | 5.5 | 0.32 | 0.63 | 10.2 |
| 15 | 30 | 90 10% | 30 | 5.4 | 0.32 | 0.64 | 10.2 |

TABLE V

Structure, composition, and EL properties of the OLEDs of Examples 16–18. Entries have the same meaning as in Table I except that Row 2 indicates the layer and sublayers of the HTL and ETL according to FIGS. 6–8.

| Example | Thickness (nm) % rubrene 641 or 740 or 841 | 642 or 842 | 643 or 843 | 660 or 761 or 861 | 762 or 862 | 763 or 863 | Luminance yield (cd/A) | CIE x | CIE y | Drive voltage (V) |
|---|---|---|---|---|---|---|---|---|---|---|
| 16 | 90 0 | 30 5% | 30 0 | 35 | | | 2.3 | 0.38 | 0.52 | 8.7 |
| 17 | 150 | | | 10 | 10 5% | 15 | 2.2 | 0.35 | 0.59 | 9.7 |
| 18 | 90 0 | 30 5% | 30 0 | 10 | 10 5% | 15 | 2.2 | 0.37 | 0.53 | 9.5 |

TABLE VI

Examples, Comparative Examples, and lifetime extension factors $LEF_{90}$

| Example | Comparative Example | $LEF_{90}$ |
|---|---|---|
| 2 | 1 | 1.3 |
| 3 | 1 | 1.8 |
| 4 | 1 | >2.2 |
| 5 | 1 | 2.1 |
| 6 | 1 | >2.2 |
| 8 | 7 | 1.8 |
| 9 | 7 | 3.3 |
| 13 | 12 | 0.88 |
| 14 | 12 | 1.04 |
| 15 | 12 | 1.24 |

The invention has been described in detail with particular reference to certain preferred embodiments thereof, but it will be understood that variations and modifications can be effected within the spirit and scope of the invention.

PARTS LIST

| | |
|---|---|
| 100 | OLED with a simple structure |
| 110 | substrate |
| 120 | anode |
| 150 | emission layer |
| 170 | cathode |
| 200 | OLED with a multilayer structure |
| 210 | substrate |
| 220 | anode |
| 230 | hole-injection layer (HIL) |
| 240 | hole-transport layer (HTL) |
| 250 | emission layer (EML) |
| 260 | electron-transport layer (ETL) |
| 270 | cathode |
| 300 | OLED |
| 310 | substrate |
| 320 | anode |
| 330 | hole-injection layer |
| 340 | hole-transport layer |
| 342 | hole-transport sublayer 1 |
| 343 | hole-transport sublayer 2 |
| 350 | emission layer |
| 360 | electron-transport layer |
| 370 | cathode |
| 400 | OLED |
| 410 | substrate |
| 420 | anode |
| 430 | hole-injection layer |
| 440 | hole-transport layer |
| 450 | emission layer |
| 460 | electron-transport layer |
| 461 | electron-transport sublayer 1 |
| 462 | electron-transport sublayer 2 |
| 470 | cathode |
| 500 | OLED |
| 510 | substrate |
| 520 | anode |
| 530 | hole-injection layer |
| 540 | hole-transport layer |
| 542 | hole-transport sublayer 1 |
| 543 | hole-transport sublayer 2 |
| 550 | emission layer |
| 560 | electron-transport layer |
| 561 | electron-transport sublayer 1 |
| 562 | electron-transport sublayer 2 |
| 570 | cathode |
| 600 | OLED |
| 610 | substrate |
| 620 | anode |
| 630 | hole-injection layer |
| 640 | hole-transport layer |
| 641 | hole-transport sublayer 1 |
| 642 | hole-transport sublayer 2 |
| 643 | hole-transport sublayer 3 |
| 650 | emission layer |
| 660 | electron-transport layer |
| 670 | cathode |
| 700 | OLED |
| 710 | substrate |
| 720 | anode |
| 730 | hole-injection layer |
| 740 | hole-transport layer |
| 750 | emission layer |
| 760 | electron-transport layer |
| 761 | electron-transport sublayer 1 |
| 762 | electron-transport sublayer 2 |
| 763 | electron-transport sublayer 3 |
| 770 | cathode |
| 800 | OLED |
| 810 | substrate |
| 820 | anode |
| 830 | hole-injection layer |
| 840 | hole-transport layer |
| 841 | hole-transport sublayer 1 |
| 842 | hole-transport sublayer 2 |
| 843 | hole-transport sublayer 3 |
| 850 | emission layer |

-continued

PARTS LIST

| 860 | electron-transport layer |
|---|---|
| 861 | electron-transport sublayer 1 |
| 862 | electron-transport sublayer 2 |
| 863 | electron-transport sublayer 3 |
| 870 | cathode |

What is claimed is:

1. An organic electroluminescent device comprising:
   a) a substrate;
   b) an anode and a cathode positioned relative to the substrate;
   c) an emission layer disposed between the anode and the cathode;
   d) a hole-transport layer disposed between the anode and the emission layer;
   e) an electron-transport layer disposed between the cathode and the emission layer;
   f) the hole-transport layer including two or more sublayers, one sublayer containing a stabilizing dopant, and the sublayer adjacent to the emission layer containing no stabilizing dopant; and
   g) the stabilizing dopant including rubrene or a derivative thereof.

2. The device of claim 1 further including a hole-injection layer disposed between the anode and the hole-transport layer.

3. The device of claim 1 wherein the sublayer closest to the anode has a thickness in the range of 2 to 200 nm and the sublayer closest to the emission layer has a thickness in a range of 2 to 200 nm.

4. The device of claim 1 wherein each sublayer of the hole-transport layer includes a tertiary aromatic amine.

5. The device of claim 1 wherein the stabilizing dopant includes rubrene or 5,6,11,12-tetrakis(2-naphythl)naphthacene or 6,11-diphenyl-5,12-bis(4-(6-methyl-benzothiazol-2-yl)phenyl)naphthacene.

6. The device of claim 1 wherein the stabilizing dopant includes between 0.1 and 30 percent by volume of each sublayer of the hole-transport layer in which it is present.

7. The device of claim 1 wherein the emission layer includes Alq, Gaq, Inq, or Mgq.

8. The device of claim 1 wherein the emission layer includes AND or TBADN.

9. The device of claim 1 wherein the sublayer that is closest to the anode contains no stabilizing dopant.

10. The organic electroluminescent device of claim 1 having a lifetime extension factor greater than 1.2.

11. The device of claim 1 wherein the cathode is transparent.

12. An organic electroluminescent device comprising:
    a) a substrate;
    b) an anode and a cathode positioned relative to the substrate;
    c) an emission layer disposed between the anode and the cathode;
    d) a hole-transport layer disposed between the anode and the emission layer;
    e) an electron-transport layer disposed between the cathode and the emission layer;
    f) the electron-transport layer including two or more sublayers, one sublayer containing a stabilizing dopant, and the sublayer adjacent to the emission layer containing no stabilizing dopant; and
    g) the stabilizing dopant including rubrene or a derivative thereof.

13. The device of claim 12 further including a hole-injection layer disposed between the anode and the hole-transport layer.

14. The device of claim 12 wherein the sublayer of the electron-transport layer closest to the cathode has a thickness in the range of 2 to 50 nm and the sublayer closest to the emission layer has a thickness in a range of 2 to 50 nm.

15. The device of claim 12 wherein each sublayer of the electron-transport layer includes Alq, Gaq, Inq, or Mgq.

16. The device of claim 12 wherein the stabilizing dopant includes rubrene or 5,6,11,12-tetrakis(2-naphythl)naphthacene or 6,11-diphenyl-5,12-bis(4-(6-methyl-benzothiazol-2-yl)phenyl)naphthacene.

17. The device of claim 12 wherein the stabilizing dopant comprises between 0.1 and 30 percent by volume of each sublayer of the electron-transport layer in which it is present.

18. The device of claim 12 wherein the emission layer includes Alq, Gaq, Inq, or Mgq.

19. The device of claim 12 wherein the emission layer includes AND or TBADN.

20. The device of claim 12 wherein the sublayer that is closest to the cathode contains no stabilizing dopant.

21. The organic electroluminescent device of claim 12 having a lifetime extension factor greater than 1.2.

22. The device of claim 12 wherein the cathode is transparent.

23. An organic electroluminescent device comprising:
    a) a substrate;
    b) an anode and a cathode positioned relative to the substrate;
    c) an emission layer disposed between the anode and the cathode;
    d) a hole-transport layer disposed between the anode and the emission layer;
    e) an electron-transport layer disposed between the cathode and the emission layer;
    f) the electron-transport layer including two or more sublayers, one sublayer containing a stabilizing dopant, and the sublayer adjacent to the emission layer containing no stabilizing dopant;
    g) the hole-transport layer including two or more sublayers, one sublayer containing a stabilizing dopant, and the sublayer adjacent to the emission layer containing no stabilizing dopant; and
    h) the stabilizing dopant or dopants including rubrene or a derivative thereof.

24. The device of claim 23 further including a hole-injection layer disposed between the anode and the hole-transport layer.

25. The device of claim 23 wherein the sublayer of the hole-transport layer closest to the anode has a thickness in the range of 2 to 200 nm and the sublayer of the hole-transport layer closest to the emission layer has a thickness in a range of 2 to 200 nm.

26. The device of claim 23 wherein each sublayer of the hole-transport layer includes a tertiary aromatic amine.

27. The device of claim 23 wherein the stabilizing dopant or dopants include rubrene or 5,6,11,12-tetrakis(2-naphythl)naphthacene or 6,11-diphenyl-5,12-bis(4-(6-methyl-benzothiazol-2-yl)phenyl)naphthacene.

28. The device of claim 23 wherein the stabilizing dopant comprises between 0.1 and 30 percent by volume of each sublayer of the hole-transport layer in which it is present.

29. The device of claim 23 wherein the emission layer includes Alq, Gaq, Inq, or Mgq.

30. The device of claim 23 wherein the emission layer includes AND or TBADN.

31. The device of claim 23 wherein the sublayer of the hole-transport layer that is closest to the anode contains no stabilizing dopant.

32. The device of claim 23 wherein the sublayer of the electron-transport layer that is closest to the cathode contains no stabilizing dopant.

33. The device of claim 23 wherein the sublayer of the electron-transport layer closest to the cathode has a thickness in the range of 2 to 50 nm and the sublayer closest to the emission layer has a thickness in a range of 2 to 50 nm.

34. The device of claim 23 wherein the stabilizing dopant comprises between 0.1 and 30 percent by volume of each sublayer of the electron-transport layer in which it is present.

35. The organic electroluminescent device of claim 23 having a lifetime extension factor greater than 1.2.

36. The device of claim 23 wherein the cathode is transparent.

* * * * *